(12) United States Patent
Schumacher

(10) Patent No.: US 9,021,752 B2
(45) Date of Patent: *May 5, 2015

(54) SOLAR PANEL

(75) Inventor: Holger Schumacher, Grevenbroich (DE)

(73) Assignee: Saint-Gobain Glass France, Courbevoie (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/117,752

(22) PCT Filed: Apr. 3, 2012

(86) PCT No.: PCT/EP2012/056044
§ 371 (c)(1),
(2), (4) Date: Jan. 30, 2014

(87) PCT Pub. No.: WO2012/156149
PCT Pub. Date: Nov. 22, 2012

(65) Prior Publication Data
US 2014/0157693 A1 Jun. 12, 2014

(30) Foreign Application Priority Data
May 19, 2011 (EP) .................................. 11166652

(51) Int. Cl.
*E04D 13/18* (2014.01)
*H01L 31/048* (2014.01)
(Continued)

(52) U.S. Cl.
CPC ............ *H01L 31/0484* (2013.01); *Y02E 10/547* (2013.01); *Y02E 10/546* (2013.01); *Y02E 10/50* (2013.01); *Y02B 10/12* (2013.01); *H02S 20/00* (2013.01); *H02S 20/24* (2014.12)

(58) Field of Classification Search
CPC ..... Y02E 10/50; Y02E 10/547; Y02E 10/546; H02S 20/00
USPC ................... 52/173.3; 136/244, 251; 257/433
See application file for complete search history.

(56) References Cited

U.S. PATENT DOCUMENTS 4,830,038 A  5/1989 Anderson et al.
5,008,062 A  4/1991 Anderson et al.
(Continued)

FOREIGN PATENT DOCUMENTS

DE    3513910    10/1986
DE    19712747   11/1998
(Continued)

OTHER PUBLICATIONS

PCT International Search Report mailed on May 22, 2012 for PCT Application No. PCT/EP2012/056044 filed on Apr. 3, 2012 in the name of Saint-Gobain Glass France (English + German).
(Continued)

Primary Examiner — Chi Q Nguyen
(74) Attorney, Agent, or Firm — Steinfl & Bruno, LLP

(57) ABSTRACT

A solar panel is described. The solar panel has at least a support layer and, arranged one on top of the other, a first intermediate layer, at least one solar cell, a second intermediate layer, and a front pane. The solar panel also has a first edge reinforcing layer and a second edge reinforcing layer, at least one terminal housing, and at least two collecting conductors which connect the solar cell to the terminal housing in an electrically conductive manner. The support layer has a portion that projects over the periphery of the front pane. The first edge reinforcing layer is arranged above the peripheral projection and has a cutout. The second edge reinforcement layer is arranged above the first edge reinforcement layer and has an opening. The collecting conductor is located in a cut-out section and in an opening.

20 Claims, 11 Drawing Sheets

(51) Int. Cl.
  *H01L 31/042* (2014.01)
  *H02S 20/24* (2014.01)

(56) References Cited

U.S. PATENT DOCUMENTS

| | | | |
|---|---|---|---|
| 6,075,201 A | 6/2000 | Wambach | |
| 6,369,315 B1 | 4/2002 | Mizukami et al. | |
| 7,854,095 B2 * | 12/2010 | Banister | 52/173.3 |
| 8,209,920 B2 * | 7/2012 | Krause et al. | 52/173.3 |
| 8,835,744 B2 * | 9/2014 | Park | 136/244 |
| 2008/0041434 A1 | 2/2008 | Adriani et al. | |
| 2008/0196757 A1 * | 8/2008 | Yoshimine | 136/244 |
| 2009/0178350 A1 * | 7/2009 | Kalkanoglu et al. | 52/173.3 |
| 2009/0205270 A1 * | 8/2009 | Shaw et al. | 52/173.3 |
| 2010/0065116 A1 | 3/2010 | Stancel et al. | |
| 2010/0077682 A1 * | 4/2010 | Adams | 52/220.6 |
| 2010/0258183 A1 | 10/2010 | Nattermann et al. | |
| 2011/0017278 A1 * | 1/2011 | Kalkanoglu et al. | 136/251 |
| 2011/0048504 A1 | 3/2011 | Kinard et al. | |

FOREIGN PATENT DOCUMENTS

| | | |
|---|---|---|
| DE | 102005020129 | 11/2006 |
| DE | 102008049890 | 4/2010 |
| DE | 102009016735 | 10/2010 |
| EP | 1717866 | 11/2006 |
| EP | 1860705 | 11/2007 |
| EP | 1983578 | 10/2008 |
| EP | 2042822 | 4/2009 |
| FR | 2362494 | 3/1978 |
| FR | 2922363 | 4/2009 |
| JP | 09228595 | 9/1997 |
| JP | 2003161003 | 6/2003 |
| JP | 2005209960 | 8/2005 |
| JP | 2009141216 | 6/2009 |
| WO | 2008148524 | 12/2008 |

OTHER PUBLICATIONS

Written Opinion of the International Searching Authority mailed on May 22, 2012 for PCT Application No. PCT/EP2012/056044 filed on Apr. 3, 2012 in the name of Saint-Gobain Glass France (English + German).

PCT International Preliminary Report on Patentability issued on Nov. 19, 2013 for PCT Application No. PCT/EP2012/055802 filed on Mar. 30, 2012 in the name of Saint-Gobain Glass France (English + German).

PCT International Search Report issued on May 30, 2012 for PCT Application No. PCT/EP2012/055802 filed on Mar. 30, 2012 in the name of Saint-Gobain Glass France (English + German).

PCT Written Opinion issued on May 30, 2012 for PCT Application No. PCT/EP2012/055802 filed on Mar. 30, 2012 in the name of Saint-Gobain Glass France (English +.

PCT International Preliminary Report on Patentability issued on Nov. 19, 2013 for PCT Application No. PCT/EP2012/056044 filed on Apr. 3, 2012 in the name of Saint-Gobain Glass France (English + German).

* cited by examiner

SOLAR PANEL

CROSS REFERENCE TO RELATED APPLICATIONS

The present application is the US national stage of International Patent Application PCT/EP2012/056044 filed on Apr. 3, 2012 which, in turn, claims priority to European Patent Application EP 11166652.5 filed on May 19, 2011.

The invention relates to a solar module, a method for producing a solar module, and a flat roof with a solar module.

Photovoltaic layer systems for the direct conversion of sunlight into electrical energy are sufficiently well known. The materials and the arrangement of the layers are coordinated such that incident radiation is converted directly into electrical current by one or a plurality of semiconducting layers with the highest possible radiation yield. Photovoltaic and extensive-area layer systems are referred to as solar cells.

Solar cells contain, in all cases, semiconductor material. The highest efficiency levels known to date of more than 20% are obtained with high-performance solar cells made of monocrystalline, polycrystalline, or microcrystalline silicon or gallium arsenide. More than 80% of the currently installed solar cell power is based on crystalline silicon. Thin-film solar cells require carrier substrates to provide adequate mechanical strength. Due to the physical properties and the technological handling qualities, thin-film systems with amorphous, micromorphous, or polycrystalline silicon, cadmium telluride (CdTe), gallium arsenide (GaAs), copper indium (gallium) selenide sulfide $(Cu(In,Ga)(S,Se)_2)$, and copper zinc tin sulfo-selenide (CZTS) as well as organic semiconductors are particularly suited for solar cells. The pentenary semiconductor $Cu(In,Ga)(S,Se)_2$ belongs to the group of chalcopyrite semiconductors that are frequently referred to as CIS (copper indium diselenide or sulfide) or CIGS (copper indium gallium diselenide, copper indium gallium disulfide, or copper indium gallium disulfoselenide). In the abbreviation CIGS, S can represent selenium, sulfur, or a mixture of the two chalcogens.

An electrical circuit of a plurality of solar cells is referred to as a photovoltaic module or a solar module. The circuit of solar cells is durably protected against environmental influences in known weather-resistant superstructures. Usually, two panes made of low-iron soda lime glass and adhesion-promoting polymer films are connected to the solar cells to form a weather-resistant solar module. The solar modules can be integrated via connection boxes or connection housings into a circuit of a plurality of solar modules. The circuit of solar modules is connected to the public supply network or to an independent electrical energy supply via known power electronics.

Flat roofs of warehouses or industrial plants have a large, exposed, shadow-free area. Consequently, they are particularly well-suited for the installation of photovoltaic systems. The roofing membrane of flat roofs consists, as a rule, of metal sheets and, for example, trapezoidal metal sheets. Flat roofs customarily have only a slight pitch of 2% to 17.6% and have only a low load-bearing capacity of, for example, 75 $kg/m^2$.

Solar modules according to the prior art, in which the solar cells are laminated between two panes made of soda lime glass, have a high weight per area of, for example, 18 $kg/m^2$. Consequently, they are unsuitable for installation on flat roofs with a low load-bearing capacity.

US 2010/0065116 A1 discloses a thin glass solar module with a weight per area of 5 $kg/m^2$ to 10 $kg/m^2$. The thin glass solar module comprises a carrier layer, solar cells, and a front pane made of very thin, chemically strengthened glass. The very thin glass is flexible. The front pane is so flexible that the impact energy of a hailstone in the legally prescribed hail impact test is absorbed by the carrier layer on the back side of the solar module.

Such a structure is unsuitable for high-performance solar cells made of crystalline silicon. The crystalline silicon is brittle and would break due to the deflection of the front pane. This results, as a rule, in the destruction of large region of the solar cell, even when the front pane is so flexible that it is undamaged.

In solar modules according to the prior art, the solar cells are connected via busbars and the busbars are guided out of the solar module. As is known from US 2008/0041434 A1, the busbars are, for example, guided out of the laminate of the two panes on an external edge of the solar module. The busbars are guided around the external edge and adhesively bonded on the back side of the solar module. The exit point of the busbar from the laminate is a weak point for mechanical damage to the busbar. Moreover, moisture can readily penetrate into the solar module at the exit point.

Likewise known from US 2008/0041434 A1 is a solar module wherein the busbars are guided out through openings in the back pane facing away from the incident sunlight. The incorporation of the holes in a pane of glass is a time-consuming, cost-intensive process step. Moreover, the pane is weakened in its stability by the opening.

JP 2003 161 003 A describes an encapsulated solar module, wherein a watertight, thin connection box is arranged on the back side of the solar module. In this case, the housing of the solar module is formed in one piece from a resin.

DE 197 12 747 A1 discloses a photovoltaic solar module with an outer pane facing toward the incident light, at least one inner cover arranged at a distance behind it in the direction of the incident light, creating an intermediate space between the panes, and an edge structure surrounding the outer pane and the inner cover, sealingly connecting them to each other. Solar cells are arranged between the outer pane and the inner cover, embedded in cast resin, laminating film(s), or the like. The solar cells are connected to an electrically interconnecting system of conductors, from which connecting leads for electrical connection with other adjacent solar modules lead into the area outside the solar module.

FR 2 362 494 A1 describes a solar module with serially connected solar cells, wherein the external connector is arranged in the edge region of the solar module.

DE 10 2005 020 129 A1 describes a solar module with an electrical connection system for the electrical interconnection of the solar module. The connection system includes a connector element for the external electrical connection of the module. The connector element includes a mechanical connecting means for another connector element such that the connector system can be expanded modularly. The connector element is preferably arranged in the corner region of the solar panel or to a certain extent on a main surface of the solar panel.

WO 2008/148524 A2 discloses a solar module with an electrical connection system for the electrical interconnection of the solar module. The connection system includes a connector element that is arranged on the edge of the solar module on a projection of a first pane beyond a second pane.

EP 1 860 705 A1 discloses a stable, self-supporting solar module that is arranged on its outer regions in a mounting frame. The mounting frame has notches through which liquids situated on the solar module can drain off.

DE 10 2009 016 735 A1 describes a solar module with a front pane and a back pane wherein one of the panes has a thickness of at least 3 mm and the other has a maximum thickness of 2 mm.

DE 10 2008 049 890 A1 discloses a photovoltaic arrangement with a transparent plastic layer and a photovoltaic module arranged on one side of the transparent plastic layer. The photovoltaic module has at least one photovoltaic cell that is arranged between a front cover layer facing the transparent plastic layer and a back cover layer turned away from the plastic layer.

U.S. Pat. No. 4,830,038 A describes a solar module that is supported and encapsulated by an elastomer. The elastomer is cast in an injection molding process around the back, the sides, and a portion of the front.

The object of the present invention consists in providing a solar module with improved outward guidance of the busbars. The improved solar module should, in particular, be lightweight and suitable for installation on a flat roof.

The object of the present invention is accomplished according to the invention by a solar module in accordance with claim 1. Preferred embodiments emerge from the subclaims. The invention further comprises a method for producing a solar module. A use of the solar module according to the invention emerges from other claims.

The solar module according to the invention comprises
a) a carrier layer and, arranged one over another thereon, a first intermediate layer, at least one solar cell, a second intermediate layer, and a front pane, and
b) a first edge reinforcement layer and a second edge reinforcement layer, at least one connection housing and at least two busbars that electrically conductively connect the solar cell to the connection housing, wherein the carrier layer has a peripheral projection beyond the front pane, the first edge reinforcement layer is arranged above the peripheral projection and has a cutout, the second edge reinforcement layer is arranged above the first edge reinforcement layer and has an opening, and the busbar is arranged in the cutout and in the opening.

In the context of the invention, the terms "arranged one over another" or "arranged above" describe a congruent or a section-wise arrangement.

In an advantageous embodiment of the solar module according to the invention, the carrier layer has a peripheral projection beyond the front pane of at least 0.3 cm, preferably of 0.5 cm to 5 cm, and particularly preferably of 1 to 2 cm. The edge reinforcement layer can be arranged on the projection and, for example, be adhesively bonded to the projection. Thus, secure fastening of the edge reinforcement and additional protection of the external edge of the solar module are obtained. Moreover, the external edge of the solar module is protected against penetrating moisture, particularly in the region in which the busbars are guided out between the front pane and the carrier layer.

In an advantageous embodiment of the invention, the solar cell comprises a monocrystalline or polycrystalline solar cell, preferably with a doped semiconductor material such as silicon or gallium arsenide.

In an alternative embodiment of the invention, the solar cell comprises a thin-film solar cell, which preferably includes amorphous, micromorphous, or polycrystalline silicon, cadmium telluride (CdTe), gallium arsenide (GaAs), copper indium (gallium) selenide sulfide (Cu(In,Ga)(S,Se)$_2$), copper zinc tin sulfo-selenide (CZTS), or organic semiconductors.

Alternatively, the solar cell comprises a tandem cell made of two solar cells of different types arranged one over another, for example, a crystalline silicon solar cell in combination with a thin-film solar cell, an organic solar cell, or an amorphous silicon solar cell.

In an advantageous embodiment of the invention, the solar cell comprises all solar cells which are themselves brittle and/or whose carrier material is brittle and which break or are damaged by slight deflection or spot loading with low forces. In this case, a slight deflection means, for example, a curve with a radius of curvature of less than 1500 mm. In this case, spot loading with low forces means, for example, an indentation from the impact of a hailstone with a diameter of 25 mm and a speed of 23 m/s in a hail impact test. Damage means a degradation of the photovoltaic properties of the solar cell due to mechanical damage of the semiconductor material, of the carrier material, or electrical line connections, for example, by a short-circuit or a power interruption. The damage to the solar cell reduces the efficiency level of the solar cell, for example, immediately after the impact by more than 3%. Usually, a further degradation of the efficiency level takes place due to microcracks over the course of time.

The first and/or second intermediate layer contains an adhesive layer, preferably one or a plurality of adhesive films, particularly preferably made of ethylene vinyl acetate (EVA), polyvinyl butyral (PVB), ionomers, thermoplastic polyurethane (TPU), thermoplastic elastomer polyolefin (TPO), thermoplastic elastomer (TPE), or other materials with appropriate adhesive and moisture-proofing properties. The thickness of an adhesive layer can vary widely and is preferably from 0.2 mm to 1 mm and, in particular, 0.4 mm.

The external dimensions of the solar module according to the invention can vary widely and are preferably from 0.6 m×0.6 m to 1.2 m×2.4 m. A solar module according to the invention preferably includes from 6 to 100 solar cells or solar cell arrays. The area of an individual solar cell is preferably from 153 mm×153 mm to 178 mm×178 mm.

The front pane includes a material largely transparent to sunlight, preferably glass, particularly preferably flat glass, float glass, quartz glass, borosilicate glass, solar glass, soda lime glass, or polymers, preferably polyethylene, polypropylene, polycarbonate, polymethyl methacrylate, and/or mixtures thereof. The front pane particularly preferably includes low-iron soda lime glass with an especially high transparency to sunlight of more than 90% in a wavelength range from 300 nm to 1500 nm.

The front pane preferably includes thermally partially prestressed or prestressed glass with a prestress of 30 MPa to 120 MPa and preferably of 32 MPa to 85 MPa. The front pane can have other additional coatings, such as antireflective layers, anti-adhesive layers, or anti-scratch layers. The front pane can have microstructuring or nanostructuring on one or both sides, which, for example, reduces the reflection of incident sunlight. The front pane can be a single pane or a laminated pane made of two or more panes. The laminated pane can include additional layers, such as transparent thermoplastic adhesive layers or plastic layers.

In an advantageous embodiment of the invention, the front pane must be adequately stable and inflexible to protect the underlying solar cells against damage. Possible causes of damage are hail impact, wind load, snow load, or bending during installation as well as being stepped on by people or animals, or the dropping of a tool. At the same time, the front pane should be as thin as possible and have a low weight in order to be suitable for installation on flat roofs with low load-bearing capacity.

As experiments of the inventor have demonstrated, solar modules according to the invention with front panes made of partially prestressed or prestressed soda lime glass with a thickness of at least 0.9 mm satisfy the technical demands with regard to torsional rigidity and stability.

Front panes according to the invention with a thickness of at least 0.9 mm offer, in particular, adequate protection for the crystalline solar cells included in the solar module in the hail impact test according to IEC 61215. The hail impact test includes bombarding the front side of the solar module with hailstones with a diameter of 25 mm and a speed of 23 m/s. The front pane according to the invention has adequate stability and inflexibility to absorb the energy of the impact of a hailstone without the crystalline solar cell in the interior of the solar module being damaged.

Alternatively, the front pane can be flexible and yielding under loads. The forces occurring are absorbed by the carrier layer. Yielding front panes, i.e., front panes made of flexible materials or very thin front panes are unsuitable for solar modules with brittle or crystalline solar cells. The crystalline solar cell would break due to the deflection of the front pane. This results, as a rule, in the destruction of a large area of the solar cell, even when the front pane is undamaged.

The thickness of the front pane substantially determines the weight of the solar module. In order to provide the most lightweight possible solar module suitable for installation on a flat roof with only a low loadbearing capacity, front panes with a thickness of a maximum of 2.8 mm are preferably used. A solar module according to the invention with a front pane with a thickness of 2.8 mm has a weight per area of roughly 10 $kg/m^2$.

Such a solar module is suitable for installation on flat roofs with a low loadbearing reserve of at least 10 $kg/m^2$.

The front pane itself according to the invention is not damaged by the hail impact test so long as the hail impact does not occur in an edge region. The edge regions of glass panes are particularly sensitive to flaking and conchoidal fractures.

The edge region of the front pane can be stabilized by an edge reinforcement. The edge reinforcement according to the invention protects the edge region of the front pane against damage in the hail impact test.

The edge reinforcement includes one or a plurality of layers, preferably made from metal, glass, rubber, plastic, or glass fiber reinforced plastic. The edge reinforcement particularly preferably includes the material of the carrier layer. The carrier layer preferably has a coefficient of thermal expansion adapted to the solar module and the front pane. As a result, only slight or no mechanical stresses appear due to different thermal expansions of the materials of the solar module.

In an advantageous embodiment of a solar module according to the invention, the top of the edge reinforcement is arranged flush with the front pane.

In an alternative embodiment of the edge reinforcement according to the invention, the edge reinforcement projects upward by a height h beyond the front pane. The height h is preferably at least 0.5 mm and particularly preferably 1 mm to 5 mm. As already stated, the outer region of a front pane is particularly susceptible to flaking or conchoidal fractures of the glass, for example, upon impact of a hailstone in the hail impact test. A protected region is created by means of the superelevation h of the edge reinforcement beyond the front pane. Because of the superelevation h of the edge reinforcement, a hailstone with a diameter of, for example, 25 mm cannot penetrate into the particularly damage susceptible edge region of the front pane. The height h can be determined by simple experiments in the hail impact test.

In another alternative embodiment of a solar module according to the invention, the edge reinforcement covers a peripheral edge region of the front pane. The edge reinforcement covers the peripheral edge region of the front pane over a width b of at least 0.3 cm, particularly preferably of 0.5 cm to 2 cm.

Since the edge reinforcement projects upward above or overlaps the front pane in sections, a border is formed that surrounds the front pane in a ring-like manner. In the event of rainfall or snowmelt, it is possible for water to collect in the region of the transition between the front pane and the edge reinforcement, which water cannot drain off because of the surrounding edge reinforcement. The stagnant water accumulation promotes the formation of algae. Moreover, the long-term effects of water can strain the moisture seals of the solar module. Also, dirt, sand, and dust that cannot be washed away by rainwater collect in this region.

The collection of water and dirt at the transition between the front pane and the edge reinforcement especially concerns solar modules on roofs that have only a slight pitch, so-called flat roofs.

Consequently, an important aspect of the present invention comprises water drain channels that are incorporated into the edge reinforcement. By means of the water drain channels, rainwater or melt water can drain off. The draining water can carry dirt, sand, and dust with it and keep the front pane of the solar module free of contaminants.

In an advantageous embodiment of a solar module according to the invention, the edge reinforcement has, on each corner of the solar module, at least one water drain channel that connects the inner side of the edge reinforcement to the external side of the edge reinforcement. Here, "external side of the edge reinforcement" means the side of the edge reinforcement that is situated on the exterior of the solar module. "Internal side of the edge reinforcement" means the side opposite the external side of the edge reinforcement In an advantageous embodiment of the solar module according to the invention, the edge reinforcement has at least one water drain channel on each peripheral external side of the solar module.

The width of the water drain channel is advantageously selected such that a hailstone with a diameter of 25 mm at a speed of 23 m/s does not damage the front pane with central or lateral impact on the water drain channel. The width of the water drain channel depends on the thickness of the edge reinforcement, i.e., on the height of the superelevation of the edge reinforcement beyond the front pane, and can be determined by simple experiments. In an advantageous embodiment of the solar module according to the invention, the water drain channel (8.1, 8.2) has a width (d) from 0.5 mm to 5 mm, preferably from 2.5 mm to 5 mm.

The edge reinforcement includes a first edge reinforcement layer and a second edge reinforcement layer. The first and/or the second edge reinforcement layer can consist of two or more parts. The first and the second second edge reinforcement layers can, alternatively, be designed in one piece and have a first region that forms the first edge reinforcement layer and a second region that forms the second edge reinforcement layer.

The first edge reinforcement layer is arranged, at least in sections, above the peripheral projection of the carrier layer beyond the front pane. The first edge reinforcement layer is, in particular, on the side of the solar module on which the busbars are guided out of the solar module, arranged above the peripheral projection. The first edge reinforcement layer has one or a plurality of cutouts, preferably two cutouts.

The second edge reinforcement layer is arranged above the first edge reinforcement layer. The second edge reinforcement layer has one or a plurality of openings, preferably two openings.

The first edge reinforcement layer and the second edge reinforcement layer are adhesively bonded to each other by adhesive layers and/or to the carrier layer and the front pane. The adhesive layers seal the edge region of the solar module against the entry of moisture and insulate the voltage-carrying parts of the solar module. The adhesive layers preferably contain an acrylic adhesive, ethylene vinyl acetate (EVA), silicone, or a double-sided adhesive film.

The cutout of the first edge reinforcement layer is designed open toward the layer structure consisting of intermediate layers, solar cells, and the front pane. The cutout is arranged at the point at which the busbar leaves the layer structure, with the busbar arranged inside the cutout after exiting the layer structure. The thickness of the first edge reinforcement layer is preferably less than the thickness of the layer structure. The second edge reinforcement layer is arranged above the first edge reinforcement layer and can overlap it. The opening of the second edge reinforcement layer is arranged above the cutout of the first edge reinforcement layer and forms a common cavity therewith.

At least one connection housing, preferably one connection housing for each busbar, is arranged above the opening of the second edge reinforcement layer. The busbar is arranged, after exiting the layer structure and before entering the connection housing, inside the cavity consisting of the cutout of the first edge reinforcement layer and the opening of the second edge reinforcement layer.

The busbar exits the edge reinforcement through the opening. The busbar is electrically conductively connected to the connecting leads in the connection housing. The connection is preferably made via plugs, contact pins, contact prongs, spring elements, crimp connections, solder joints, welded joints, or other electrical line connections. In an advantageous embodiment of the solar module according to the invention, the connection housing covers the complete opening. The connection housing and/or the cavity formed by the opening and the cutout can be sealed by a casting compound. The casting compound seals the solar module against penetrating moisture and contains, for example, polyurethane, acryl, silicone, or other suitable sealing materials.

The cutout of the first edge reinforcement layer is implemented, for example, as a rectangle, with pointed or rounded corners, or as a semicircle. The cutout can also have other shapes, in which one or a plurality of busbars can be arranged. The cutout is preferably delimited in a narrow region around the busbars.

The opening of the second edge reinforcement layer is preferably implemented rectangular, square, or circular, with all shapes inside which the busbar can be expediently arranged equally suitable.

An important aspect of the invention comprises the adaptation of the coefficient of thermal expansion of the front pane and the carrier layer: Different coefficients of thermal expansion of the front pane and the carrier layer can, with temperature changes, result in different thermal expansion. A different thermal expansion of the front pane and the carrier layer can result in a deflection of the solar module and, thus, in damage to the crystalline solar cells. Temperature changes of more than 100° C. occur, for example, during lamination of the solar module or during warming of the solar module on the roof.

The second coefficient of thermal expansion, i.e., the coefficient of thermal expansion of the front pane, is preferably from $8\times10^{-6}$/K to $10\times10^{-6}$/K and for partially prestressed soda lime glass, for example, from $8\times10^{-6}$/K to $9.3\times10^{-6}$/K.

In an advantageous embodiment of the solar module according to the invention, the difference between the first coefficient of thermal expansion of the carrier layer of a solar module according to the invention and the second coefficient of thermal expansion of the front pane is ≤300%, preferably ≤200%, and particularly preferably 50% of the second coefficient of thermal expansion of the front pane.

In an advantageous embodiment of the solar module according to the invention, the carrier layer includes a glass fiber reinforced plastic. The glass fiber reinforced plastic includes, for example, a multilayer glass fiber fabric that is embedded in a cast resin molding material made of unsaturated polyester resin. The glass content of the glass fiber reinforced plastic is preferably from 30% to 75% and particularly preferably from 50% to 75%.

In an advantageous embodiment of the solar module according to the invention, the carrier layer has a first coefficient of thermal expansion from $7\times10^{-6}$/K to $35\times10^{-6}$/K, preferably from $9\times10^{-6}$/K to $27\times10^{-6}$/K, and particularly preferably from $9\times10^{-6}$/K to $20\times10^{-6}$/K.

In an alternative embodiment of the solar module according to the invention, the difference between the first coefficient of thermal expansion and the second coefficient of thermal expansion is ≤17%, preferably ≤12%, and particularly preferably ≤7% of the second coefficient of thermal expansion.

In an advantageous embodiment of the solar module according to the invention, the carrier layer includes a metal foil with a first coefficient of thermal expansion from $7.3\times10^{-6}$/K to $10.5\times10^{-6}$/K. The first intermediate layer can include a stack sequence of at least one first adhesive layer, one insulating layer, and one second adhesive layer. The insulating layer preferably includes a solid insulating film, made, for example, of polyethylene terephthalate (PET). The insulating layer has the task of insulating the busbars and the back side of the solar cells from the electrically conductive metal foil of the carrier layer. The metal foil preferably includes a stainless steel, preferably a high-grade steel of the EN material numbers 1.4016, 1.4520, 1.4511, 1.4017, 1.4113, 1.4510, 1.4516, 1.4513, 1.4509, 1.4749, 1.4724 or 1.4762.

Another aspect of the invention comprises a flat roof with
a) a roofing membrane with a pitch of 1% (0.6°) to 23.1% (13°),
b) at least one solar module according to the invention, arranged on the roofing membrane,
wherein the roofing membrane and the solar module according to the invention are connected to each other at least in sections by at least one adhesive layer and/or connecting means.

In an advantageous embodiment of the flat roof according to the invention, the pitch is from 2% (1.1°) to 17.6% (10°), preferably from 5% (2.9°) to 17.6% (10°), and particularly preferably from 5% (2.9°) to 8.8% (5°).

The adhesive layer, with which the solar module according to the invention and the roofing membrane are connected, preferably includes acrylate adhesives, a buthyl adhesive, a bitumen adhesive, or a silicone adhesive, or a double-sided adhesive film. The connecting means preferably include screw, clamp, or rivet connections and/or retaining rails, guide rails, or cums made of plastic or metal, such as aluminum, steel, or stainless steel.

In an advantageous embodiment of the flat roof according to the invention, the roofing membrane includes a plastic, preferably polymethyl methacrylate (PMMA, Plexiglas®), polyester, bitumen, polymer-modified bitumen, polyvinyl chloride (PVC), or thermoplastic olefin elastomers (TPOs), preferably with a flat, box-shaped or corrugated profile.

In an alternative embodiment, the roofing membrane includes a metal sheet, preferably a metal sheet made of copper, aluminum, steel, galvanized steel, and/or plastic-coated steel. The metal sheet has, for example, a trapezoidal profile and is referred to in the following as "trapezoidal metal sheet". Additional layers can be arranged over or under the roofing membrane, for example, layers for thermal insulation. The layers for thermal insulation preferably include plastics or plastic foams, for example, made of polystyrene or polyurethane.

The bolt connection of the solar module to the roofing membrane of a flat roof according to the invention is preferably carried out in a region of the edge reinforcement of the solar module and, in particular, in the region of the projection of the carrier layer beyond the front pane. This has the particular advantage that no hole need be incorporated in the front pane. Incorporating a hole in the glass front pane is a time-consuming, cost-intensive process step. Moreover, the stability of the front pane is reduced by the hole.

Another aspect of the invention comprises a method for producing a solar module according to the invention, wherein at least:
a) a first edge reinforcement layer with at least one cutout is arranged on a projection of the carrier layer beyond the front pane and the busbars are guided through the cutout,
b) a second edge reinforcement layer with at least one opening is arranged above the first edge reinforcement layer and the busbars are guided through the opening, and
c) at least one connection housing is connected to the busbars.

At least one first intermediate layer, one solar cell, and one second intermediate layer are arranged between the carrier layer and the front pane. The carrier layer, first intermediate layer, solar cell, second intermediate layer, and front pane are bonded to each other by lamination, preferably at a temperature of 100° C. to 170° C. The structure obtained is referred to in the following as "laminated layer sequence".

In an advantageous embodiment of the method according to the invention, the edge reinforcement is formed from at least one first edge reinforcement layer and a second edge reinforcement layer arranged flush with the surface of the front pane. The first edge reinforcement layer and the second edge reinforcement layer can be designed as one piece or multiple pieces and are, for example, bonded to each other and to the laminated layer sequence by adhesive layers.

The first edge reinforcement layer and the second edge reinforcement layer preferably include a glass fiber reinforced plastic.

In an advantageous embodiment of the method according to the invention, the edge reinforcement is formed from at least one first edge reinforcement layer and at least one second edge reinforcement layer overlapping the front pane, in sections, in an edge region. The first edge reinforcement layer and the second edge reinforcement layer are bonded by adhesive layers to the laminated layer sequence and to each other.

In an advantageous embodiment of the method according to the invention, the edge reinforcement is arranged, before lamination, on the carrier layer and is bonded to the layer sequence by the lamination process.

In an alternative embodiment of the method according to the invention, a strand with the cross-section of the edge reinforcement is extruded, the strand is divided into segments, and cutouts as well as openings are incorporated in the segments. Additionally, water drain channels can be incorporated in the segments. Then, the segments of the edge reinforcement are bonded to the laminated layer sequence, for example, adhesively bonded.

The edge reinforcement is extruded by extrusion methods known per se, in which plastics or other viscous, curable materials are pressed through a specially shaped nozzle in a continuous process. A strand of any length with the cross-section of the nozzle is created. The strand can be divided into segments that have, in each case, the length of one side of the solar module. Alternatively, the strand can be divided into segments that have, in each case, a peripheral length of the solar module. The plastics can be thermoplastic plastics that are heated during the extrusion.

The cutouts, openings, and water drain channels are preferably introduced by cutting or milling into the surface of the segments. The water drain channels can be introduced into the surface of the segments during the extrusion, for example, by a movable mold. Alternatively, the water drain channels can be incorporated into the segments after extrusion and before adhesive bonding to the laminated layer sequence. In another alternative, the water drain channels can be introduced after the adhesive bonding to the laminated layer sequence.

Extruded edge reinforcements preferably include polyvinyl chloride (PVC), polyethylene (PE), polypropylene (PP), polyamide (PA), high-density polyethylene (HDPE), low-density polyethylene (LDPE), acrylonitrile-butadiene-styrene copolymer (ABS), polycarbonate (PC), styrene butadiene (SB), polymethyl methacrylate (PMMA), polyurethane (PUR), and polyethylene terephthalate (PET).

In an alternative embodiment of the method according to the invention, the edge reinforcement is produced by reaction injection molding (RIM) or by an injection molding process.

In the method known per se of reaction injection molding (RIM), two components (and possibly other additives) are mixed intensively in a mixer and then immediately injected as a reaction molding compound into a shaping mold. Curing occurs in the shaping mold. The cutouts, openings, and water drain channels can already be defined by the shaping mold or can be introduced after curing into the blank of the edge reinforcement.

Particularly suitable for production of an edge reinforcement by reaction injection molding are plastics such as polyurethane (PUR), high-density polyethylene (HDPE), low-density polyethylene (LDPE), polyurea, and polyisocyanurate (PIR).

In the injection molding method known per se, melts of thermoplastic plastics are preferably pressed in a shaping mold. The cutouts, openings, and water drain channels can be defined already by means of the mold or introduced after curing in the blank of the edge reinforcement.

Another aspect of the invention comprises the use of a solar module according to the invention on a flat roof, preferably on a metal flat roof of a building or a vehicle for transportation on water, on land, or in the air. Flat roofs of warehouses, industrial plants, and garages or shelters such as carports whose roofs have a large, exposed, shadow-free area and a low roof pitch are especially suitable for the installation of solar modules according to the invention.

Another aspect of the invention comprises the use of the solar module according to the invention on a flat roof with a pitch from 1%) (0.6°) to 23.1% (13°), preferably from 2% (1.1°) to 17.6% (10°), particularly preferably from 5% (2.9°) to 17.6% (10°), and very particularly preferably from 5% (2.9°) to 8.8% (5°).

BRIEF DESCRIPTION OF THE DRAWINGS

The invention is explained in detail in the following with reference to drawings and an example. The drawings are not completely true to scale. The invention is in no way restricted by the drawings.

They depict.

DETAILED DESCRIPTION OF THE DRAWINGS

Figure 1A:
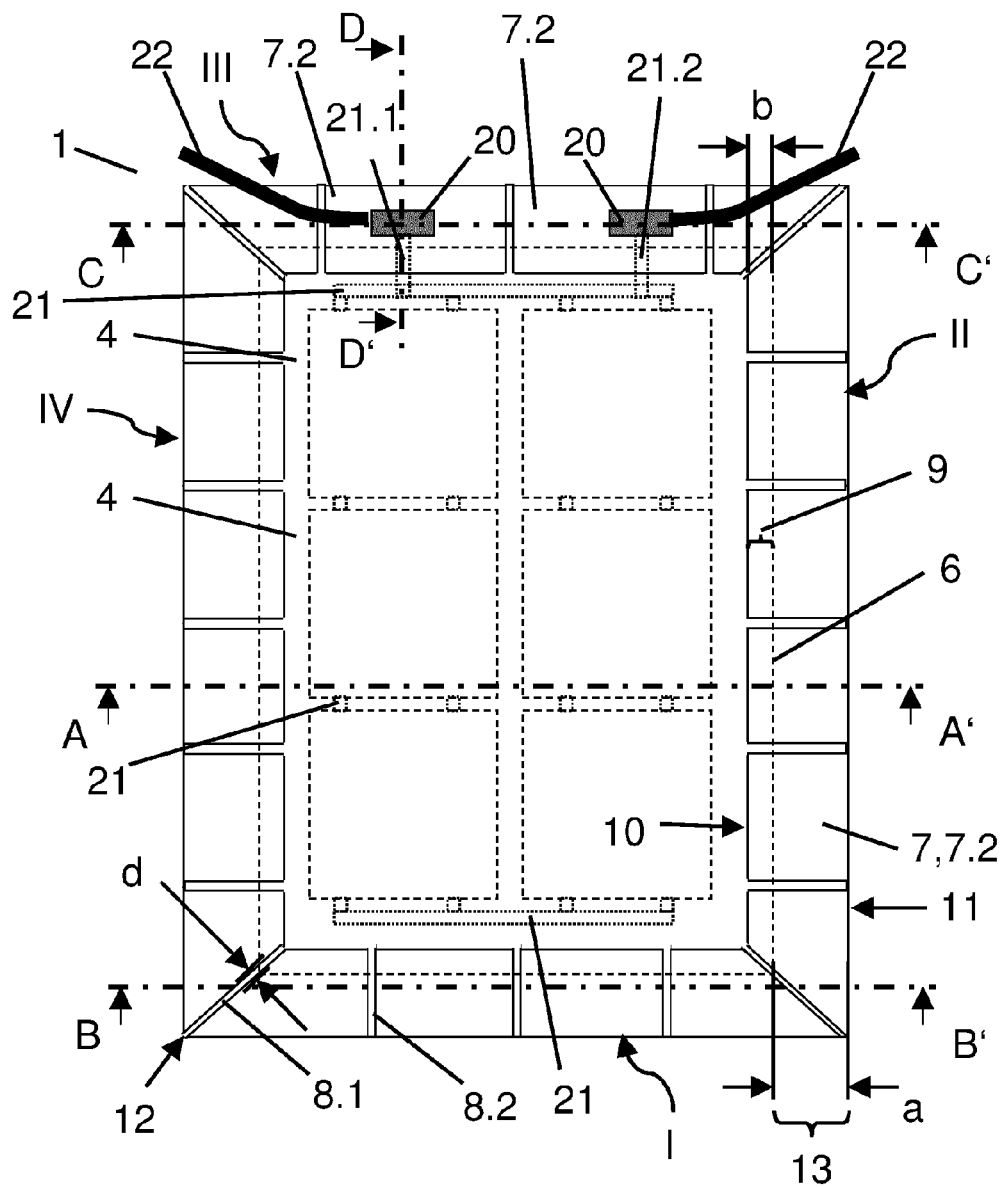
FIG. 1A a schematic view of an exemplary embodiment of a solar module according to the invention, FIG. 1B a cross-sectional view along the section line D-D' of FIG. 1A, FIG. 1C a cross-sectional view along the section line C-C' of FIG. 1A, FIG. 1D a cross-sectional view along the section line A-A' of FIG. 1A, FIG. 1E a cross-sectional view along the section line B-B' of FIG. 1A, FIG. 1F a simplified schematic view of the connection region of the solar module according to the invention of FIG. 1A, FIG. 2 a cross-sectional view of the edge of an alternative exemplary embodiment of the solar module according to the invention, FIG. 3 a schematic view of another exemplary embodiment of a solar module according to the invention, FIG. 4 a cross-sectional view of the layer structure of an alternative exemplary embodiment of the solar module according to the invention, FIG. 5A a cross-sectional view of a flat roof according to the invention, FIG. 5B a cross-sectional view of an alternative embodiment of a flat roof according to the invention, FIG. 5C a cross-sectional view of an another alternative embodiment of a flat roof according to the invention, FIG. 6A a cross-sectional view of an exemplary embodiment of the solar module according to the invention along the section line A-A' of FIG. 1A, FIG. 6B a detail of FIG. 2A with a hailstone in the hail impact test, and FIG. 7 a detailed flow chart of the method according to the invention.

FIG. 1A illustrates a solar module according to the invention referred to as a whole by the reference number 1. FIG. 1A depicts a top view of the front, i.e., of the side facing the sun, of the solar module. The back of the solar module 1 is, in the context of the present invention, the side facing away from the front. The sides surrounding the outer edges of the front and the back are referred to in the following as external sides I, II, III, IV of the solar module 1.

The solar module 1 comprises a plurality of serially connected solar cells 4, of which six are depicted in FIG. 1A. The solar cells 4 are, in this example, monocrystalline silicon solar cells. Each solar cell has a nominal voltage of, for example, 0.63 V, such that the solar module 1 has a total nominal voltage of 3.8 V. The voltage is guided out via two busbars 21.1, 21.2 to two connection housings 20 in the edge region of side III of the solar module 1. The electrical line connection to the connecting leads 22 takes place in the connection housings 20. The connecting leads 22 are connected to a power grid or to other solar modules (not shown here).

The busbars 21.1, 21.2 are electrically conductively connected to the solar cells 4. A busbar 21 customarily includes a metal strip, for example, a tinned copper strip with a thickness of 0.03 mm to 0.3 mm and a width of 2 mm to 16 mm. Copper has proven its value for such busbars since it has good electrical conductivity as well as good processability into foils. At the same time, the material costs are low. Other electrically conductive materials that can be processed into foils can also be used. Examples for this are aluminum, gold, silver, or tin and alloys thereof.

Figure 1B:
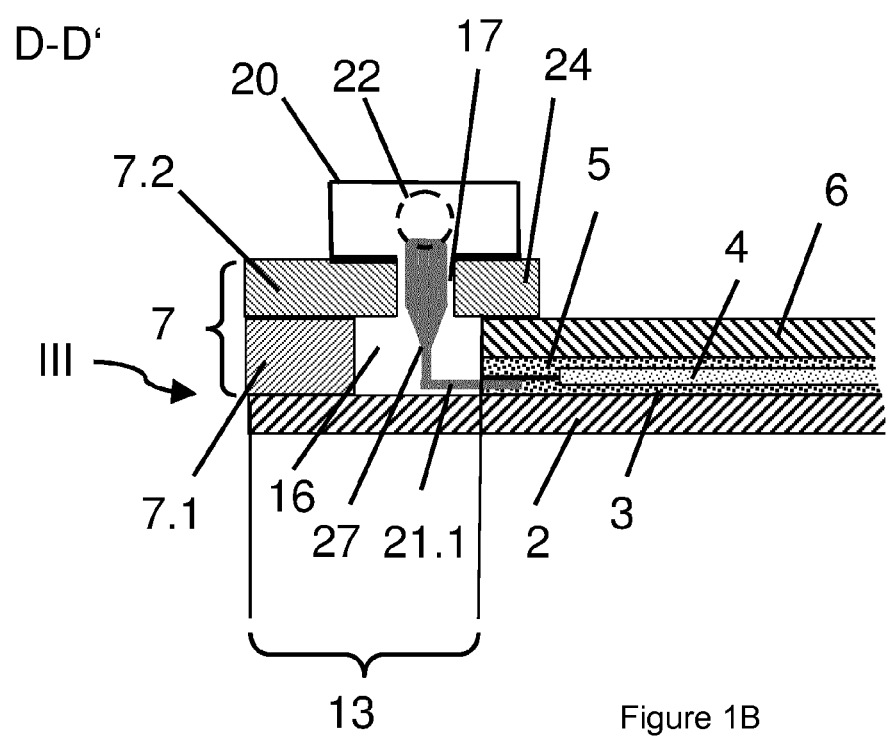
Figure 1C:
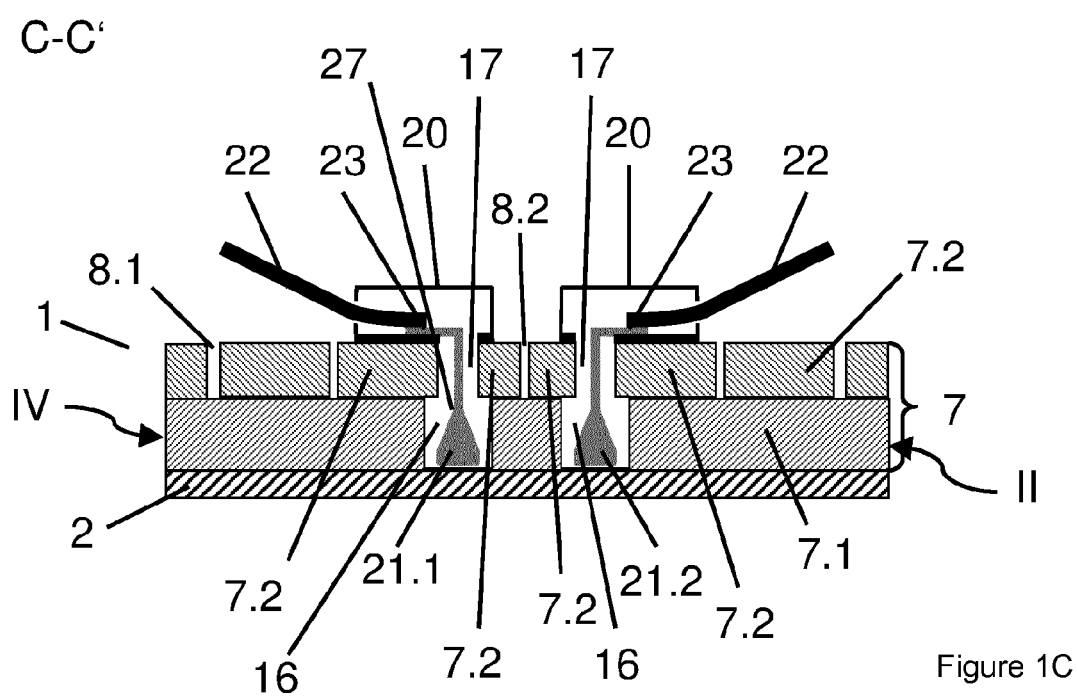

FIG. 1B depicts a cross-sectional view along the section line D-D' and FIG. 1C a cross-sectional view along the section line C-C' of FIG. 1A. The solar module 1 according to the invention comprises a layer structure made up of carrier layer 2, first intermediate layer 3, solar cell 4, second intermediate layer 5, and front pane 6. The carrier layer 2 has a peripheral projection 13 beyond the front pane 6 of, for example, 2 cm. The solar module 1 according to the invention has a first edge reinforcement layer 7.1 with a cutout 16. The first edge reinforcement layer 7.1 is arranged above the projection 13. In addition, a second edge reinforcement layer 7.2 with an opening 17 is arranged above the first edge reinforcement layer 7.1. The second edge reinforcement layer 7.2 covers a peripheral edge region 9 of the front pane 6 of, for example, 1 cm.

The busbars 21.1, 21.2 are connected on one end to the solar cell 4 and, on the other end, via an electrical line connection 23 to the connecting leads 22. The busbars 21.1, 21.2 are arranged in the region of the edge reinforcement 7 inside the cutout 16 of the first edge reinforcement layer 7.1 and inside the opening 17 of the second edge reinforcement layer 7.2. The busbar 21 is rotated inside the cutout 16 by 90° along its central axis. The site of the rotation is designated with the reference character 27.

Figure 1D:
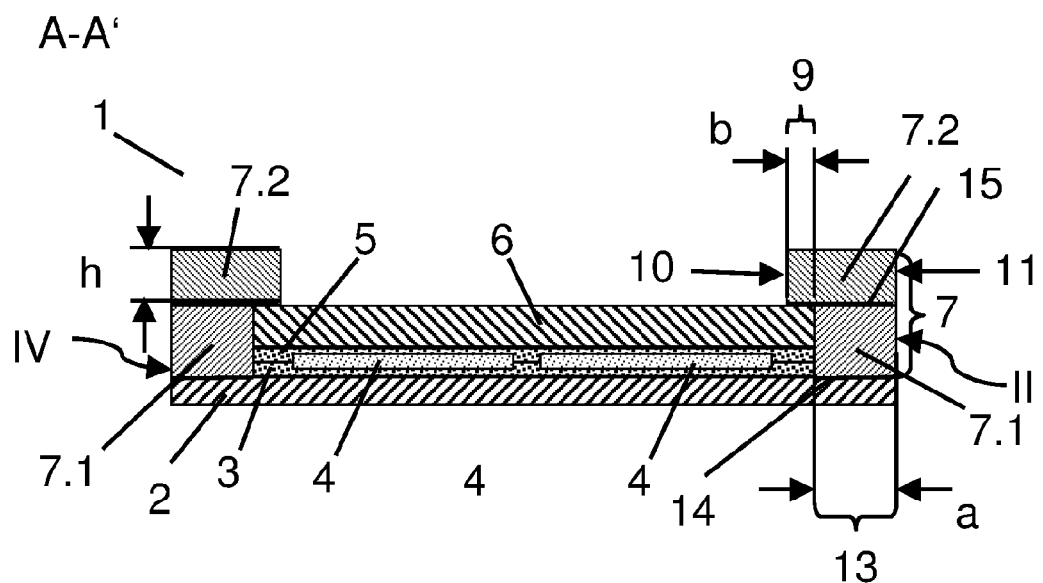

FIG. 1D depicts a cross-sectional view along the section line A-A' of FIG. 1A. From FIG. 1D, the layer structure of the solar module 1 according to the invention is again discernible. The solar module 1 includes a carrier layer 2 made, for example, from a glass fiber reinforced plastic. The glass fiber reinforced plastic includes, for example, a multilayer glass fiber fabric that is embedded in a cast resin molding material made of unsaturated polyester resin. The carrier layer 2 has, for example, a glass content of 54%, a weight per area of 1.65 kg/mm$^2$, and a thickness of 1 mm.

A first intermediate layer 3 is arranged above the carrier layer 2. The first intermediate layer 3 includes, for example, an adhesive film made of ethylene vinyl acetate (EVA) with a thickness of 0.4 mm.

A plurality of crystalline solar cells 4, of which three are depicted in FIG. 1D, are arranged above the first intermediate layer 3. The crystalline solar cell 4 consists, for example, of a monocrystalline silicon solar cell with a size of 156 mm×156 mm. All solar cells 4 of a solar module 1 according to the invention are electrically conductively connected to each other via busbars, in serial connection or parallel connection, depending on the intended use. In addition, blocking diodes and bypass diodes can be integrated into the solar module 1.

A second intermediate layer 5, which includes, for example, an adhesive film made of ethylene vinyl acetate (EVA) with a thickness of 0.4 mm, is arranged above the solar cells 4.

A front pane 6 is arranged above the second intermediate layer 5. The front pane 6 includes, for example, a low-iron soda lime glass with a thickness from 0.9 mm to 2.8 mm and, in particular, of 1 mm. The soda lime glass is thermally partially prestressed with a prestress of, for example, 40 MPa. Partially prestressed glass is distinguished from prestressed glass by a slower cooling process. The slower cooling process results in lower voltage differences between the core and the surfaces of the glass. The bending strength of partially prestressed glass falls between that of non-prestressed and prestressed glass. Partially prestressed glass has, in the event of breakage, a high residual load-bearing capacity and is, consequently, particularly suitable for fall-prevention glazings on buildings or in the roof area.

The carrier layer 2 has a first coefficient of thermal expansion of, for example, 27×10$^{-6}$/K. The front pane 6 has a second coefficient of thermal expansion of, for example, $9 \times 10^{-6}$/K. The difference between the first and second coefficient of thermal expansion is $18 \times 10^{-6}$/K and is thus 200% of the second coefficient of thermal expansion.

The carrier layer 2 has, in this exemplary embodiment, a peripheral projection 13 beyond the front pane 6. The width a of the projection is preferably from 0.5 cm to 10 cm and, for example, 2 cm. The edge reinforcement 7 is arranged above the projection 13 of the carrier layer 2 and above an edge region 9 of the front pane 6. The width b of the edge region 9 is preferably 0.5 cm to 10 cm and, for example, 1 cm. The edge reinforcement 7 includes one first edge reinforcement layer 7.1 and one second edge reinforcement layer 7.2. The first edge reinforcement layer 7.1 is connected via an adhesive layer 14 and, for example, via a double-sided adhesive tape to the carrier layer 2. The thickness of the first edge reinforcement layer 7.1 is, for example, selected such that the top of the first edge reinforcement layer 7.1 and the top of the front pane 6 form a flush, flat surface. The first edge reinforcement layer 7.1 can even include a layer sequence of a plurality of layers and, for example, of two layers. The first edge reinforcement layer 7.1 can even include only an adhesive, for example, a double-sided adhesive tape, with the thickness of the adhesive tape compensating the height difference between carrier layer 2 and front pane 6.

The second edge reinforcement layer 7.2 is arranged in sections above the first edge reinforcement layer 7.1 and above an edge region 9 of the front pane 6. The second edge reinforcement layer 7.2 ist bonded by an adhesive layer 15 to the first edge reinforcement layer 7.1 and to the edge region 9 of the front pane 6. The second edge reinforcement layer 7.2 protects the sensitive outer edge region 9 of the front pane 6 against damage, for example, against hail impact.

The edge reinforcement 7 with a first edge reinforcement layer 7.1 and a second edge reinforcement layer 7.2 can just as easily be made in one piece, for example, from a plastic such as polyurethane (PU) or polyvinyl chloride (PVC). The edge reinforcement 7 made in one piece then has a first section with a, for example, strip-shaped cutout and a second section with a, for example, round opening that is arranged above the strip-shaped cutout of the first section. The edge reinforcement 7 can, for example, be produced by extrusion, injection molding, or reaction injection molding (RIM).

Figure 1E:
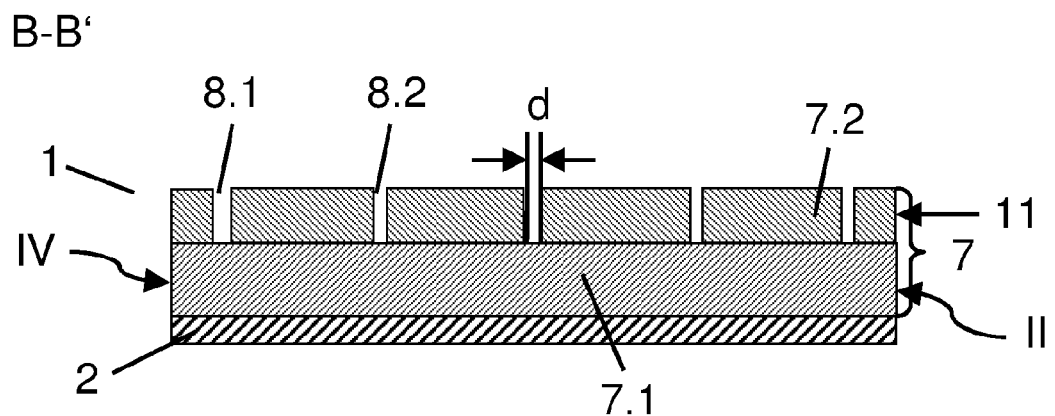

FIG. 1E depicts a cross-sectional view along the section line B-B' of FIG. 1A. A plurality of water drain channels 8.1, 8.2 in the form of cutouts are arranged in the second edge reinforcement layer 7.2. The water drain channels 8.1, 8.2 connect the inner edge 10 of the second edge reinforcement layer 7.2 to the outer edge 11 of the second edge reinforcement layer 7.2. The width d of the water drain channels 8.1, 8.2 is from 1 mm to 5 mm and, for example, 3 mm. The width d of the water drain channels 8.1, 8.2 and the thickness of the second edge reinforcement layer 7.2 are selected such that a hailstone with a diameter of 25 mm does not damage the front pane in the hail impact test. This can be determined in the context of simple experiments.

In the exemplary embodiment of a solar module 1 according to the invention depicted in FIG. 1A-E, a water drain channel 8.1 is in each case arranged in each corner 12 of the solar module 1. The water drain channels 8.1 are arranged, for example, at an angle of 45° relative to the external sides I, II, III, IV of the solar module 1. Moreover, each long external side II, IV of the solar module 1 has five water drain channels 8.2, and each short external side I, III of the solar module 1 has three water drain channels 8.2. The water drain channels 8.2 on the external sides I, II, III, IV of the solar module 1 are, for example, arranged perpendicular to the external sides I, II, III, IV of the solar module 1.

The solar module 1 according to the invention has a weight per area of roughly 5.6 kg/m².

Figure 1F:
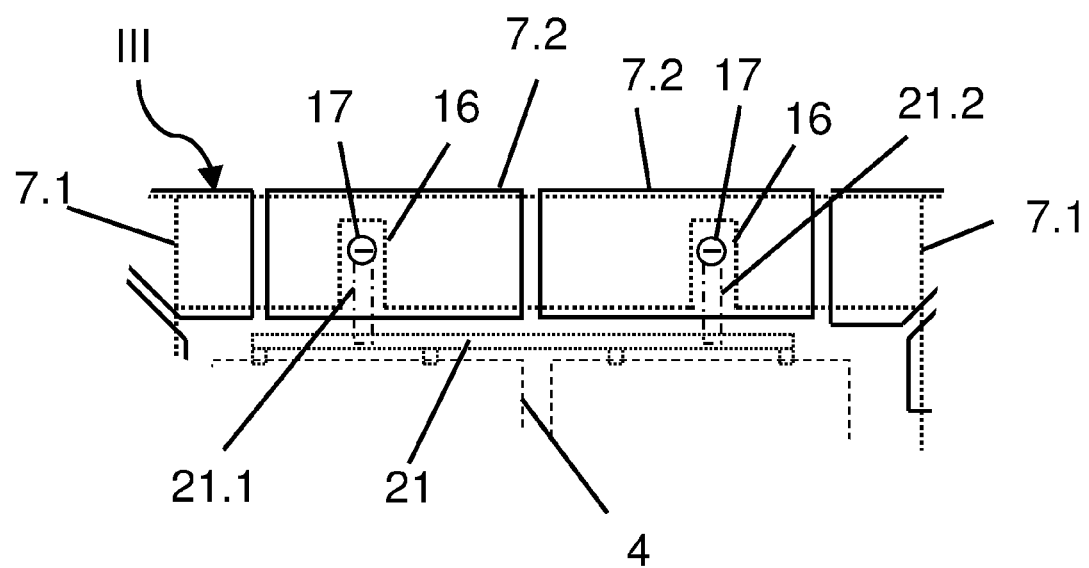

FIG. 1F depicts a simplified schematic view of the connection region of the solar module according to the invention of FIG. 1A. The first edge reinforcement layer 7.1 is arranged below the second edge reinforcement layer 7.2. The cutouts 16 of the first edge reinforcement layer 7.1 are arranged below the openings 17 of the second edge reinforcement layer 7.2. The busbars 21.1, 21.2 run inside the cutout 16 all the way to below the openings 17. There, the busbars 21.1, 21.2 are guided upward at right angles to the carrier layer 2 and out of the second edge reinforcement layer 7.2. For the sake of clarity, the connection housing and connecting leads are not shown in FIG. 1F.

Figure 2:
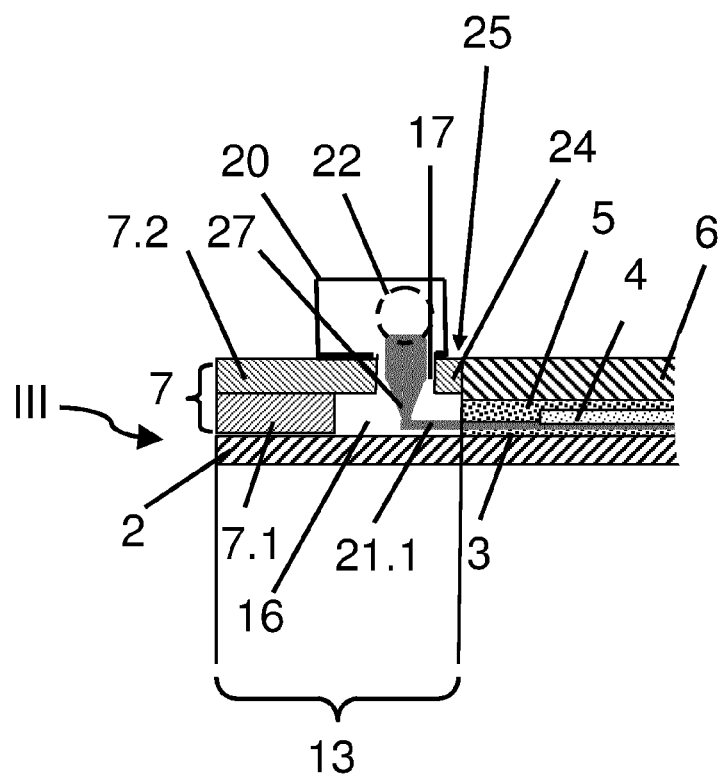

FIG. 2 depicts a cross-sectional view of the edge of an alternative exemplary embodiment of the solar module according to the invention. The first edge reinforcement layer 7.1 and the second edge reinforcement layer 7.2 have, in each case, a thickness corresponding to roughly half of the layer structure made of first intermediate layer 3, solar cells 4, second intermediate layer 5, and front pane 6. The second edge reinforcement layer 7.2 forms a flush transition 25 with the front pane 6. This embodiment is especially suitable for thick front panes 6, preferably with a thickness of more than 2.8 mm. In contrast to thin front panes 6, thick front panes 6 are not damaged in the hail impact test by bombardment with hail in the edge region of the front pane 6.

Figure 3:
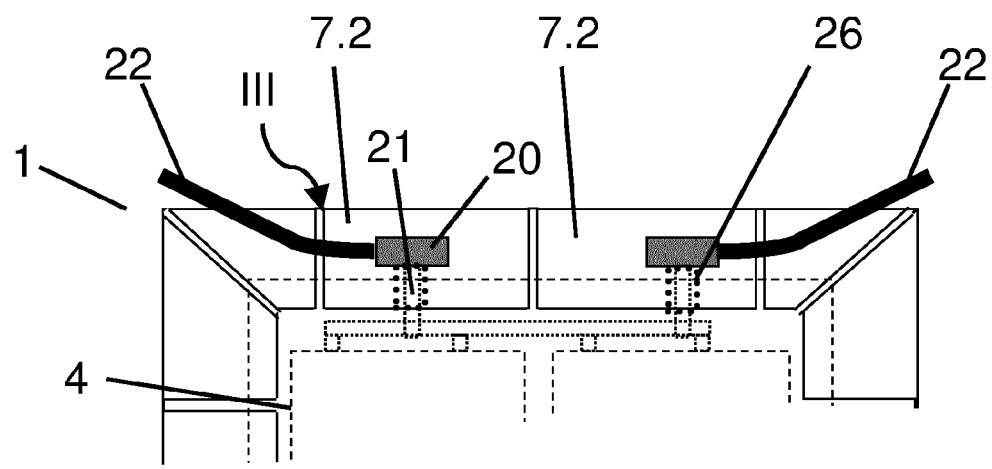

FIG. 3 depicts a schematic view of another exemplary embodiment of a solar module according to the invention. The busbars 21 include, for example, a metal foil made of tinned copper with a width of 5 mm and a thickness of 0.2 mm. The busbars 21 can have additional insulation 26, for example, a polyimide film or a buthyl rubber, in a region where they protrude beyond the front pane (6). The insulation 26 can be arranged on the top, i.e., the side of the bus bar 21 facing the front pane 6. In an advantageous embodiment, the insulation 16 encases the busbar 21, on the top, the bottom, and the two external sides. The insulation 26 insulates the busbars against moisture that penetrates into the intermediate space between the front pane 6 and the edge reinforcement 7.

Figure 4:
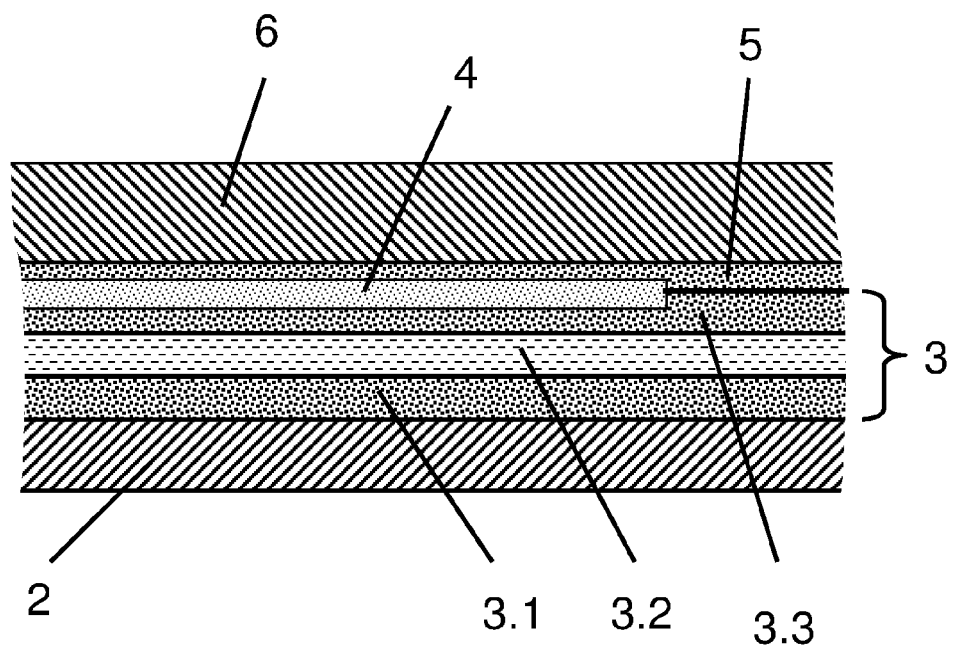

FIG. 4 depicts a cross-sectional view of the layer structure of an alternative exemplary embodiment of the solar module 1 according to the invention. The layer structure includes a carrier layer 2, a first intermediate layer 3, crystalline solar cells 4, a second intermediate layer 5, and a front pane 6. The carrier layer 2 includes, in this exemplary embodiment, a metal foil, for example, a foil made of a stainless high-grade steel such as Nirosta, material number 1.4016, with a thickness of 0.3 mm.

In an advantageous embodiment of the solar module 1 according to the invention, the first intermediate layer 3 includes a stack sequence of a first adhesive layer 3.1, an insulating layer 3.2, and a second adhesive layer 3.3. The first adhesive layer 3.1 and the second adhesive layer 3.3 include, for example, an adhesive film made of ethylene vinyl acetate (EVA) with a thickness of 0.4 mm. The insulating layer 3.2 includes a solid insulating film, for example, made of polyethylene terephthalate (PET) with a thickness of 50 μm. The insulating layer 3.2 has the task of insulating the busbars 21 and the back side of the solar solar cells 4 from the electrically conductive metal foil of the carrier layer 2. The electrical insulation by means of the additional insulating layer 3.2 is especially important since, in particular, unevennesses and solder joints of the solar cells 4 and busbars 21 can pierce a thin, comparatively soft intermediate layer of ethylene vinyl acetate (EVA) during the lamination process. This can result in short circuits and leakage currents in the solar module 1.

Figure 5A:
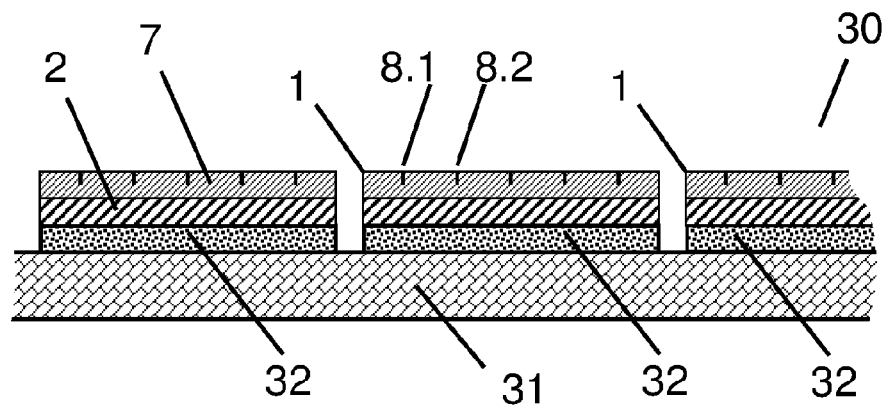

FIG. 5A depicts a cross-sectional view of a flat roof 30 according to the invention with solar modules 1 according to the invention. The solar modules 1 are depicted in a cross-section along the section line B-B' of FIG. 1A. The roofing membrane 31 of the flat roof 30 according to the invention includes, for example, a membrane made of bitumen, polymer-modified bitumen, thermoplastic olefin elastomers (TPOs), or polyvinyl chloride (PVC). The solar modules 1 are in each case adhesively bonded to the roofing membrane 31 via an adhesive layer 32. The adhesive layer 32 includes, for example, buthyl, acryl, bitumen, silicone, or another weather-resistant adhesive. The roofing membrane 31 of the flat roof 30 has, for example, a pitch of 3°.

In the event of rain or snow melt, the water accumulating on the front pane can drain off via the water drain channels 8.1 and 8.2.

Figure 5B:
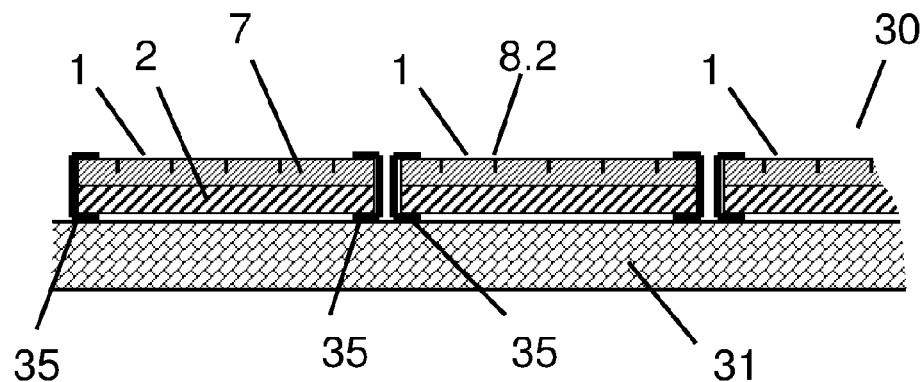

FIG. 5B depicts a cross-sectional view of an alternative embodiment of a flat roof 30 according to the invention. The solar modules 1 are depicted in a cross-section along the section line B-B' of FIG. 1A. A plurality of U-shaped retaining rails 35 are fixedly connected to the roofing membrane 31 of the flat roof 30. The retaining rails 35 include, for example, a plastic or a metal such as aluminum. The solar modules 1 according to the invention are introduced on two opposing external sides I, III or II, IV into the U-shaped retaining rails and retained thereby.

Figure 5C:
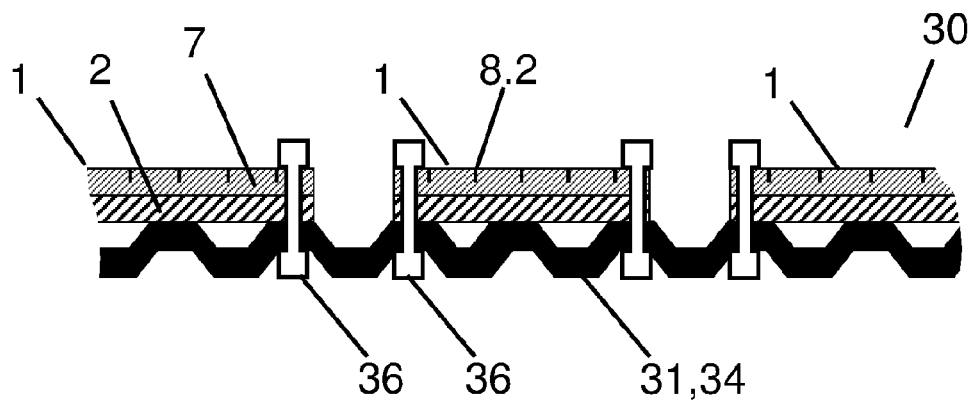

FIG. 5C depicts a cross-sectional view of another alternative embodiment of a flat roof 30 according to the invention. The solar modules 1 are depicted in a cross-section along the section line B-B' of FIG. 1A. The roofing membrane 31 includes a trapezoidal metal sheet 34 with high points, so-called webs, and depressions situated therebetween, so-called corrugations. The distance from one corrugation center to the next is, for example, 207 mm. The profile depth, i.e., the height difference between web and corrugation is, for example, 35 mm. The trapezoidal metal sheet has a thickness of, for example, 0.75 mm and is made from a galvanized steel sheet. The solar modules 1 are bolted to the trapezoidal metal sheet 34 in the region of the edge reinforcement 7 and in particular in the region of the projection of the carrier layer 2 beyond the front pane 6.

Figure 6A:
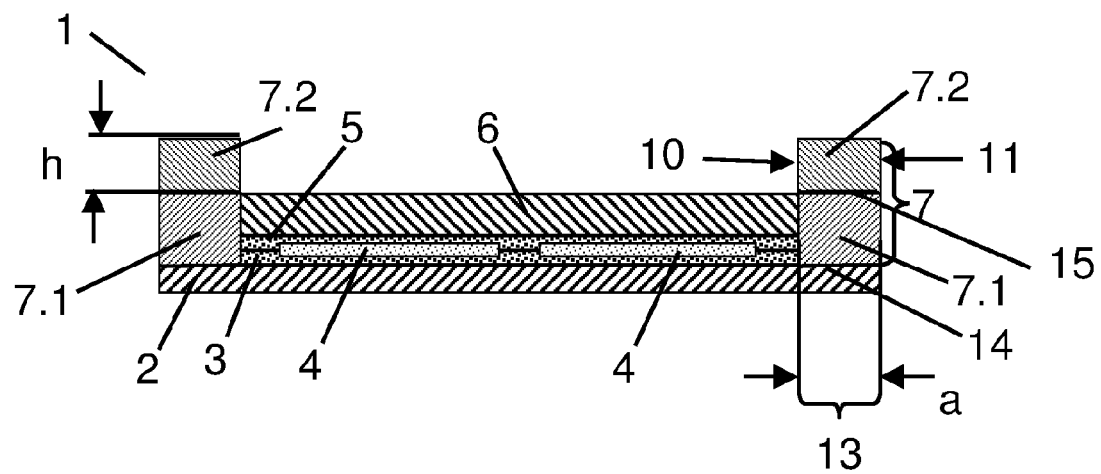

FIG. 6A depicts a cross-sectional view of an alternative embodiment of a solar module 1 according to the invention along the section line A-A' of FIG. 1A. The embodiment differs from the example of FIG. 1B in that the second edge reinforcement 7.2 does not overlap the front pane 6. The second edge reinforcement 7.2 projects upward by a height h beyond the front pane 6. The height h is, for example, 1 mm.

Figure 6B:
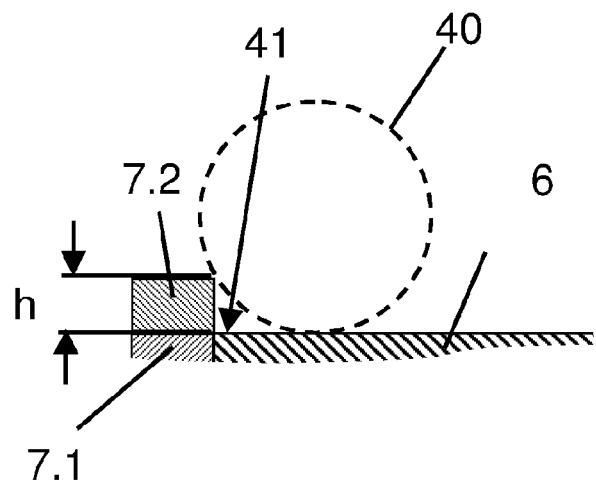

FIG. 6B depicts a detail of the edge of the solar module 1 of FIG. 6A. The outer region of a front pane 6 is especially susceptible to flaking or conchoidal fractures of the glass, for example, with striking of a hailstone 40 in the hail impact test. A protected region 41 is created by means of the superelevation h of the second edge reinforcement layer 7.2 beyond the front pane 6. A hailstone 40 with a diameter of, for example, 25 mm cannot advance into the especially damage susceptible region 41 of the front pane 6 because of the superelevation h of the second edge reinforcement layer 7.2. The height h can be determined by simple experiments in the hail impact test.

Figure 7:
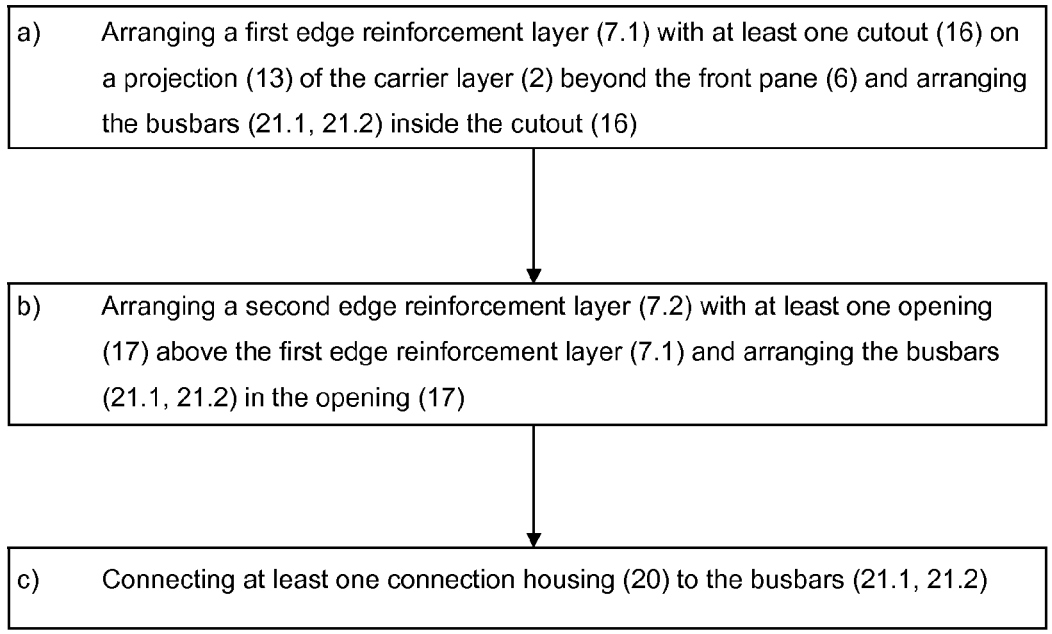

FIG. 7 depicts a detailed flow chart of the method according to the invention.

REFERENCE CHARACTERS 1 solar module
2 carrier layer
3 first intermediate layer
3.1 first adhesive layer
3.2 insulating layer
3.3 second adhesive layer
4 solar cell
5 second intermediate layer
6 front pane
7 edge reinforcement
7.1 first edge reinforcement layer
7.2 second edge reinforcement layer
8.1, 8.2 water drain channel
9 edge region of the front pane 6
10 internal side of the edge reinforcement 7
11 external side of the edge reinforcement 7
12 corner of the solar module 1
13 projection of the carrier layer 2 beyond the front pane 6
14 adhesive layer
15 adhesive layer
16 cutout
17 opening
20 connection housing
21, 21.1, 21.2 busbars
22 connecting leads
23 electrical line connection between busbar 21 and connecting lead 22
25 flush transition between front pane 6 and edge reinforcement 7
26 insulation of busbars 21
27 rotation of the busbar 21
30 flat roof
31 roofing membrane
32 adhesive layer
34 trapezoidal metal sheet
35 retaining rail, U-shaped rail
36 bolt connection
40 hailstone
41 region of the front pane 6
a width of the projection 13 of the carrier layer 2 beyond the front pane 6
b width of the edge region 9
d width of the water drain channel 8.1, 8.2
h height of superelevation of edge reinforcement 7 beyond front pane 6
A-A' section line
B-B' section line
C-C' section line
D-D' section line
I, II, III, IV side, external side of the solar module 1

The invention claimed is:

1. A solar module, comprising:
   a carrier layer, a first intermediate layer, at least one solar cell, a second intermediate layer, and a front pane arranged one over another, and
   a first edge reinforcement layer and a second edge reinforcement layer, at least one connection housing, and at least two busbars that electrically conductively connect the at least one solar cell to the at least one connection housing,
   wherein the carrier layer has a peripheral projection beyond the front pane, the first edge reinforcement layer is arranged above the peripheral projection and has a cutout, the second edge reinforcement layer is arranged above the first edge reinforcement layer and has an opening, and the at least two busbars are arranged in the cutout and in the opening.

2. The solar module according to claim 1, wherein the second edge reinforcement layer covers at least one peripheral edge region of the front pane of at least 0.2 cm.

3. The solar module according to claim 2, wherein the second edge reinforcement layer covers at least one peripheral edge region of the front pane of 0.5 cm to 5 cm.

4. The solar module according to claim 1, wherein the second edge reinforcement layer has at least one water drain channel on each corner of the solar module, which connects an internal side and an external side of the second edge reinforcement layer.

5. The solar module according to claim 4, wherein the at least one water drain channel has a width of 0.3 mm to 5 mm.

6. The solar module according to claim 5, wherein the at least one water drain channel has a width of 2 mm to 4 mm.

7. The solar module according to claim 1, wherein the second edge reinforcement layer has, on each external side of the solar module, at least one water drain that connects an internal side and an external side of the second edge reinforcement layer.

8. The solar module according to claim 1, wherein the at least one solar cell is a monocrystalline or polycrystalline solar cell and contains a doped semiconductor material.

9. The solar module according to claim 8, wherein the doped semiconductor material is silicon or gallium arsenide, or a tandem cell with a crystalline solar cell.

10. The solar module according to claim 1, wherein the front pane contains thermally partially prestressed or prestressed glass with a thickness of 0.9 mm to 2.8 mm.

11. The solar module according to claim 1, wherein the carrier layer has a first coefficient of thermal expansion and the front pane has a second coefficient of thermal expansion, and a difference between the first coefficient of thermal expansion and the second coefficient of thermal expansion of the front pane is less than or equal to 300% of the second coefficient of thermal expansion.

12. The solar module according to claim 1, wherein the carrier layer includes a glass fiber reinforced plastic with a first coefficient of thermal expansion of $7.3 \times 10^{-6}$/K to $35 \times 10^{-6}$/K.

13. The solar module according to claim 1, wherein the carrier layer has a peripheral projection beyond the front pane of at least 0.3 cm.

14. The solar module according to claim 13, wherein the carrier layer has a peripheral projection beyond the front pane of 0.5 cm to 5 cm.

15. A flat roof with a solar module, comprising:
a roofing membrane with a pitch of 1% to 23.1%, and
at least one solar module according to claim 1, arranged on the roofing membrane,
   wherein the roofing membrane and the at least one solar module are connected to each other at least in sections by at least one of a connecting means and at least one adhesive layer.

16. A method for producing a solar module, comprising:
arranging a first edge reinforcement layer with at least one cutout on a peripheral projection of the carrier layer beyond the front pane and the at least two busbars are guided through the cutout,
arranging a second edge reinforcement layer with at least one opening arranged above the first edge reinforcement layer and guiding the at least two busbars through the opening, and
connecting at least one connection housing to the at least two busbars,
thus producing the solar module according to claim 1.

17. The method according to claim 16, wherein the second edge reinforcement overlaps an edge region of the front pane at least in sections.

18. A method comprising:
using the solar module according to claim 1 on a flat roof of a building or of a vehicle for transportation on water, on land, or in the air.

19. A method comprising:
using the solar module according to claim 1 on a flat roof with a pitch of 1% to 23.1%.

20. The method according to claim 19, wherein the pitch is 2% to 17.6%.

* * * * *